United States Patent
Bae

(10) Patent No.: US 6,342,808 B1
(45) Date of Patent: Jan. 29, 2002

(54) HIGH VOLTAGE GENERATING CIRCUIT

(75) Inventor: Il Man Bae, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/519,162

(22) Filed: Mar. 6, 2000

(30) Foreign Application Priority Data

Sep. 17, 1999 (KR) .............................................. 99-40126

(51) Int. Cl.⁷ .................................................. G05C 1/46
(52) U.S. Cl. ........................ 327/537; 327/541; 327/543
(58) Field of Search ................................ 327/535, 536, 327/537, 538, 541, 543, 546; 363/59, 60, 44, 45; 365/226, 189.09

(56) References Cited

U.S. PATENT DOCUMENTS

| 5,337,284 A | * | 8/1994 | Cordoba et al. | ............ | 327/540 |
| 5,742,197 A |   | 4/1998 | Kim et al.     | .................. | 327/537 |
| 5,808,953 A |   | 9/1998 | Kim et al.     | .................. | 365/226 |
| 6,128,242 A | * | 10/2000 | Banba et al.  | ................ | 365/226 |
| 6,130,829 A | * | 10/2000 | Shin           | ............................. | 363/60 |
| 6,172,932 B1 | * | 1/2001 | Kim           | ............................ | 365/227 |

* cited by examiner

*Primary Examiner*—Timothy P. Callahan
*Assistant Examiner*—Terry L. Englund
(74) *Attorney, Agent, or Firm*—Skjerven Morrill MacPherson

(57) ABSTRACT

A high voltage generating circuit comprises a secondary high voltage detector, a secondary high voltage generator, a primary high voltage detector, and a primary high voltage generator. An active signal enables the secondary high voltage detector, which when active, asserts a second signal upon detecting a drop of a high voltage signal and/or in response to a first signal. The secondary high voltage generator boosts the high voltage signal in response to the second signal. The primary high voltage detector asserts the first signal upon detecting the drop in the high voltage signal. The primary high voltage generator boosts the high voltage signal in response to the first signal. Accordingly, in active mode, the secondary high voltage generator can quickly and accurately compensate for a drop in the high voltage signal, since the secondary high voltage detector signals the drop of the high voltage signal before a word line is enabled.

6 Claims, 4 Drawing Sheets

HIGH VOLTAGE GENERATING CIRCUIT

FIELD OF THE INVENTION

The present invention relates to a high voltage generating circuit for a semiconductor memory device.

DESCRIPTION OF THE PRIOR ART

A conventional memory cell of a dynamic random access memory (DRAM) device includes an NMOS transistor and a capacitor. The NMOS transistor is between the capacitor and a bit line and has a gate coupled to a word line. When a voltage on the word line is high, the NMOS transistor turns on to transmit data stored in the memory cell to the bit line or to store data from the bit line in the memory cell. When transferring a data signal having a logic high level, the NMOS transistor can cause a voltage drop because the gate-to-source voltage difference of the NMOS transistor must be greater than or equal to the threshold voltage of the NMOS transistor. Accordingly, DRAMs commonly use a high voltage generating circuit that generates a high voltage signal at a level higher that the logic high level of the data signals. When the word line is at the high voltage from the high voltage generating circuit, the NMOS transistor can transfer a logic high data signal without the voltage drop associated with the transistor's threshold voltage.

DRAMs also commonly include an NMOS transistor as a bit line select transistor to control the transmission of data between a data line and a bit line. A data signal at the logic high level can be transmitted without a voltage drop if the high voltage signal from the high voltage generating circuit is applied to a gate of the NMOS select transistor.

A high voltage generating circuit of a conventional semiconductor memory device includes a primary high voltage detector, a primary high voltage generator, a secondary high voltage detector, and a secondary high voltage generator. The primary high voltage detector and generator generate and monitor a high voltage signal in a standby mode and in an active mode. The secondary high voltage detector and generator supplement operation of the primary high voltage detector and generator in the active mode. More specifically, the charge loss or current from the high voltage is typically greater than the primary high voltage generator can supply without a drop in the output voltage. Accordingly, the secondary high voltage generator operates to maintain the high voltage level. However, a fast semiconductor memory device requires that a word line be enabled within a very short time after an active command. The conventional primary and secondary high voltage detectors cannot easily detect a voltage drop and direct the primary and secondary high voltage generators to compensate for the voltage drop quickly enough to charge word lines to the high voltage level when the word line is enabled.

SUMMARY OF THE INVENTION

In accordance with an aspect of the present invention, a high voltage generating circuit of a semiconductor memory device maintains a high voltage after an active command and before a word line is enabled. To accomplish this, one embodiment of the present invention is a high voltage generating circuit includes a secondary high voltage generator and a primary high voltage generator. The secondary high voltage generator responds to an active signal designating an active mode, generates a second signal upon detecting a drop in a high voltage signal and/or in response to a first signal, and boosts the high voltage signal in response to the second signal. The primary high voltage generator generates the first signal in response to detecting a drop in the high voltage level in standby mode and in active mode, and boosts the high voltage level in response to the first signal.

According to another embodiment of the present invention, a high voltage generating circuit of a semiconductor memory device includes a secondary high voltage detector, a secondary high voltage generator, a primary high voltage detector, and a primary high voltage generator. The secondary high voltage detector responds to an active or enable signal and generates a second signal when a drop in a high voltage signal is detected and/or in response to a first signal. The primary high voltage detector generates the first signal upon detecting the drop of the high voltage signal in active and standby modes. The primary high voltage generator boosts the high voltage signal in response to the first signal. Accordingly, the secondary generator can respond more quickly and boost the high voltage signal when entering the active mode while the primary detector signals a voltage drop.

BRIEF DESCRIPTION OF THE ATTACHED DRAWINGS

DETAILED DESCRIPTION OF THE INVENTION

Figure 1:
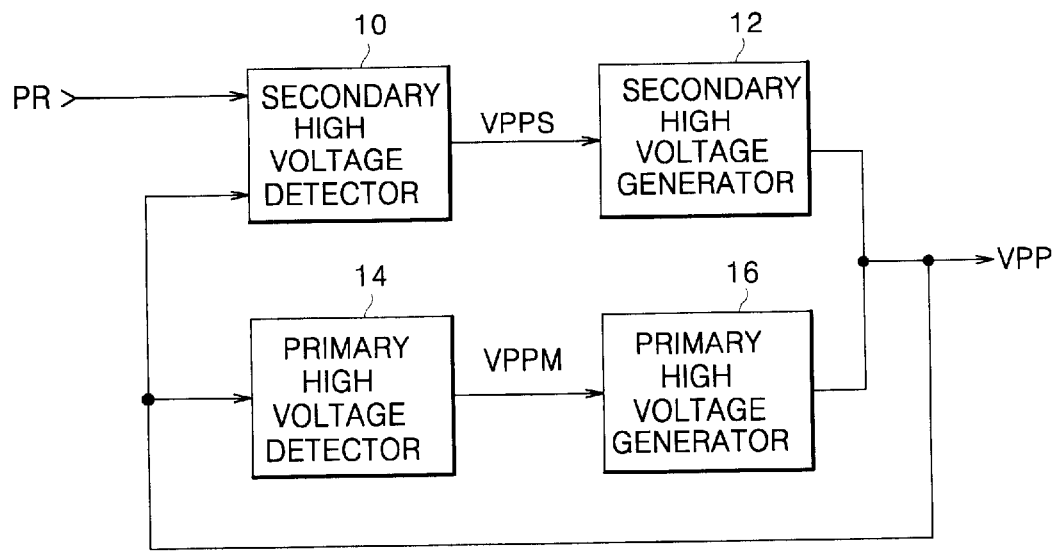
FIG. 1 is a block diagram illustrating an embodiment of a high voltage generating circuit of a conventional semiconductor memory device.

A high voltage generating circuit of a conventional semiconductor memory device is described below with reference to the attached drawings. Referring to FIG. 1, a high voltage generating circuit includes a secondary high voltage detector 10, a secondary high voltage generator 12, a primary high voltage detector 14, and a primary high voltage generator 16.

The secondary high voltage detector 10 asserts a signal VPPS in response to detecting a drop in or a low level of a high voltage signal VPP while a signal PR is asserted to designate an active mode. The secondary high voltage generator 12 performs a boosting operation in response to the signal VPPS to compensate for the drop in the high voltage signal VPP. The primary high voltage detector 14 asserts a signal VPPM in response to detecting the drop of the high voltage VPP level in a standby mode or in the active mode. In response to the signal VPPM, the primary high voltage generator 16 performs a boosting operation to generate the high voltage signal VPP from a power supply voltage VCC.

Figure 2:
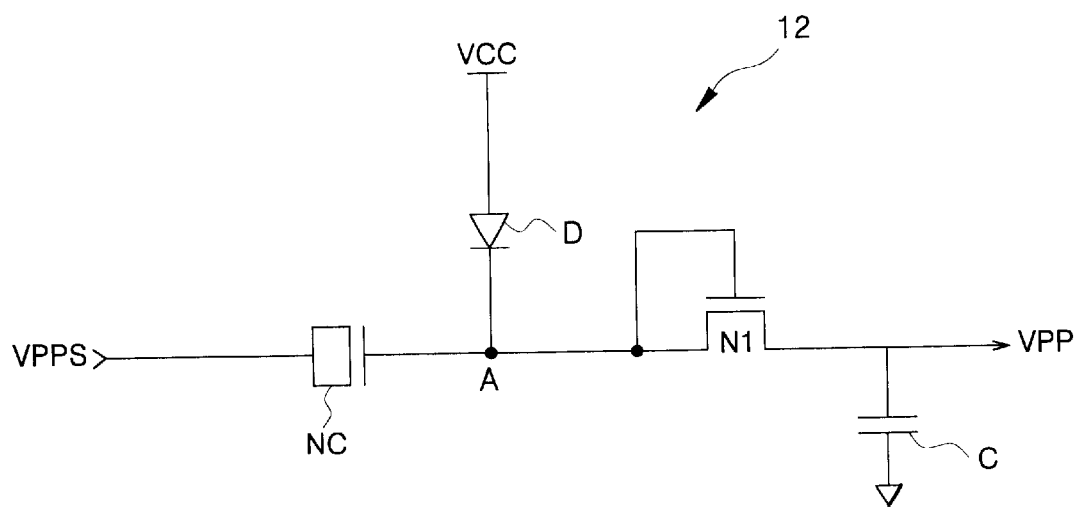
FIG. 2 is a circuit diagram illustrating an embodiment of a secondary high voltage generator shown in FIG. 1.

FIG. 2 shows an embodiment of the secondary high voltage generator. The illustrated embodiment includes an NMOS capacitor NC, a capacitor C, a diode D, and an NMOS transistor N1. In standby mode, the signal VPPS is at the ground voltage, and the diode D precharges a node A to a voltage VCC−0.7V, where 0.7 V is the on-voltage of the diode D and VCC is the power supply voltage. In active mode, the voltage of the node A rises to a voltage 2VCC−0.7V when the signal VPPS transits from the ground voltage to the power supply voltage VCC. At this time, the NMOS transistor N1 outputs the high voltage of the node A to an output terminal for the high voltage signal VPP. More particularly, the NMOS transistor N1 has the configuration of a diode and charges the capacitor C if the voltage signal VPP is currently less than the voltage on the node A by an on-voltage of the diode-connected transistor N1.

The signal VPPS returns to the low level (ground) for standby mode so that the diode D again charges the node A to the voltage VCC−0.7V. The charge in the capacitor C maintains the high voltage signal VPP on the output terminal. In the active mode, each time the signal VPPS transits to the logic high level, the voltage on the node A rises the voltage 2VCC−0.7V, and the NMOS transistor N1 outputs the boosted voltage to the output terminal for the signal VPP.

The primary high voltage generator illustrated in FIG. 1 is similar to the secondary high voltage generator but performs a boost operation in response to the signal VPPM from the primary high voltage detector 14. Further, the primary high voltage generator typically has a capacity superior to that of the secondary high voltage generator. The primary high voltage generator may include, for example, a capacitor that is larger than the corresponding capacitor NC in the secondary high voltage generator 12.

Figure 3:
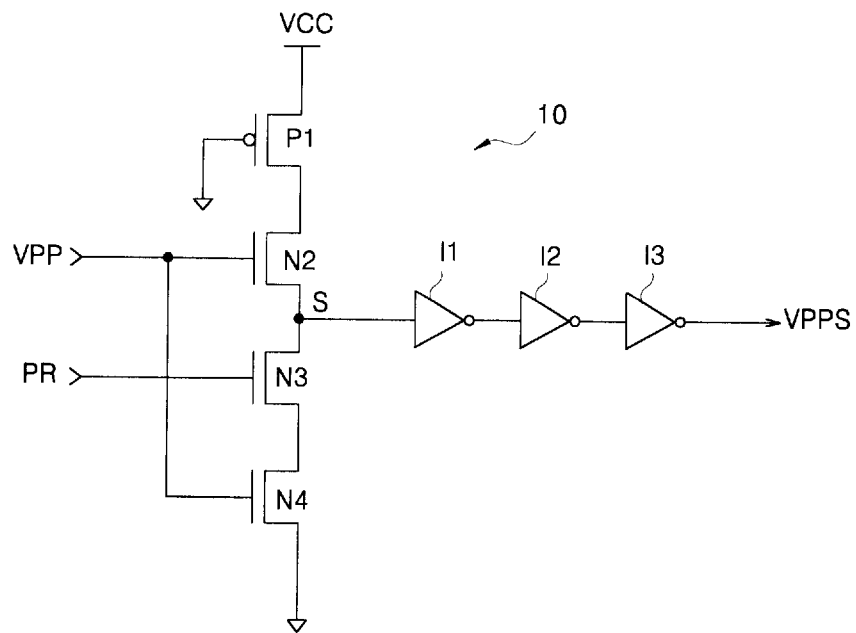
FIG. 3 is a circuit diagram illustrating an embodiment of a secondary high voltage detector shown in FIG. 1.

FIG. 3 shows an embodiment of the secondary high voltage detector 10 that includes a PMOS transistor P1, NMOS transistors N2, N3, and N4, and inverters I1, I2, and I3. The PMOS transistor P1 and the NMOS transistor N2 are connected in series between the power supply voltage VCC and a node S. The gate of the PMOS transistor P1 is grounded, and the gate of the NMOS transistor N2 receives the high voltage signal VPP. The NMOS transistors N3 and N4 are connected in series between the node S and ground. The gate of NMOS transistor N3 receives the active signal PR, and the gate of NMOS transistor N3 receives the high voltage signal VPP. The three inverters I1, I2, and I3, which are connected in series, generate the signal VPPS by buffering and inverting a signal from the node S.

When the active signal PR is at a logic high level indicating the active mode, the NMOS transistor N3 is on and enables operation of the secondary high voltage detector 10. If resistances of the PMOS transistor P1 and the NMOS transistors N2, N3, and N4 are denoted as R1 and R2, R3, and R4, respectively, the voltage on the node S is (R3+R4) VCC/(R1+R2+R3+R4). However, the resistance of the PMOS transistor P1 may be neglected because the PMOS transistor P1 operates as a current source in a saturation region. Accordingly, the voltage of the node S is approximately (R3+R4)VCC/(R2+R3+R4). The resistance R3 has a fixed value in the active mode because the voltage level of the active signal PR is constant at the logic high level in the active mode. Accordingly, the voltage of the node S changes according to the level of the high voltage signal VPP, which is on the gates of the NMOS transistors N2 and N4.

When the high voltage signal VPP on the gates of the NMOS transistors N2 and N4 maintains a sufficiently high voltage level, the resistance R2 and R4 are relatively small. As shown in the above formula, when the resistance R2 and R4 are small, the voltage of the node S becomes large (i.e., near the supply voltage VCC). In this case, the inverter I1 perceives the voltage on the node S as being at a logic high level, and the inverters I1, I2, and I3 generate the signal VPPS at the low level (ground) by inverting and delaying the high signal from the node S.

When the high voltage signal VPP applied to gates of the NMOS transistor N2 and N4 drops, the resistances R2 and R4 increase. When the high voltage signal is below a minimum level, the resistance R2 and R4 are relatively large, and the voltage of the node S drops significantly. In this case, the inverter I1 perceives the node S as being at the logic low level. The inverters I1, I2, and I3 assert the signal VPPS to the logic high level (VCC) by inverting and delaying the low-level signal from the node S.

As described above, when the high voltage signal VPP is at a sufficiently high level, the secondary high voltage detector of FIG. 3 keeps the signal VPPS at the logic low level. When the voltage level of the high voltage signal VPP drops below a minimum target level, the secondary high voltage detector asserts the signal VPPS to a logic high level if the signal PR enables the secondary high voltage detector. Accordingly, the secondary high voltage detector 10 only asserts the signal VPPS after the signal PR is at the logic high level.

Figure 4:
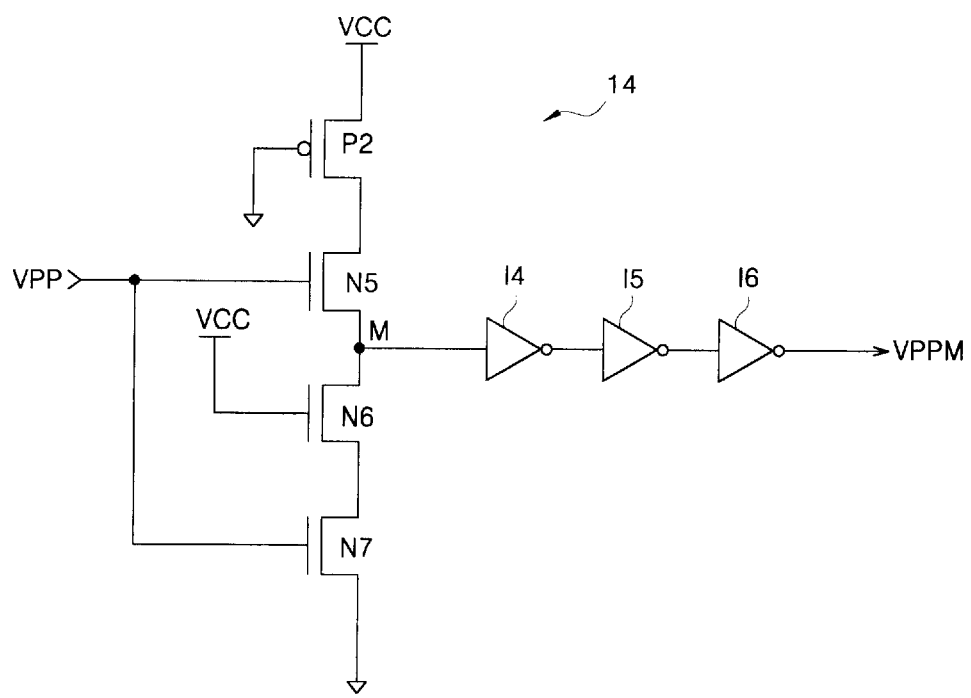
FIG. 4 is a circuit diagram illustrating an embodiment of a primary high voltage detector shown in FIG. 1.

FIG. 4 shows an embodiment of the primary high voltage detector 14. The illustrated embodiment includes a PMOS transistor P2, NMOS transistors N5, N6, and N7, and inverters I4, I5, and I6, which correspond to the PMOS transistor P1, NMOS transistors N2, N3, and N4, and inverters I1, I2, and I3 of FIG. 3. The configuration of the primary high voltage detector of FIG. 4 differs from that of the secondary high voltage detector of FIG. 3 in that the gate of the NMOS transistor N6 receives the power supply voltage VCC. Accordingly, the primary voltage detector continuously operates in standby mode and in active mode, regardless of the signal PR.

The operation of the primary high voltage detector 14 of FIG. 4 is otherwise substantially the same as that of the secondary high voltage detector of FIG. 3. In particular, when the high voltage signal VPP is sufficiently high, the transistors P2, N5, N6, and N7 keep a voltage at a node M at a logic high level. When the high voltage signal VPP drops, the voltage on the node M drops to the logic low level. Accordingly, when the high voltage signal VPP is at the desired voltage, the inverters I4, I5, and I6 keep the signal VPPM at a logic low level. When the voltage of the high voltage signal VPP drops below the desired voltage, the inverters I4, I5, and I6 assert the signal VPPM to the logic high level.

Accordingly, the high voltage generating circuit of the conventional semiconductor memory device operates the secondary high voltage detector 10 in response to the active signal PR. The primary high voltage detector 14 operates at all times to detect drops in the voltage of the high voltage signal VPP, and the primary high voltage generator 16 operates when the primary high voltage detector 14 detects a drop in the high voltage signal VPP.

Generally, the transistors of the secondary high voltage detector 10 are larger than those of the primary high voltage detector 14 so that the secondary high voltage generator 12 operates faster than the primary voltage generator 16. Accordingly, when the signal PR is active, the secondary high voltage detector 10 operates the secondary high voltage generator 12 to compensate for the voltage drop in the high voltage signal VPP. But, in a high-speed semiconductor memory device, a word line is enabled faster than the conventional secondary high voltage detector 10 can operate the secondary high voltage generator 12. Accordingly, the secondary high voltage generator 12 may only boost the high voltage signal after the word line is enabled, and the high voltage generating circuit thus cannot quickly and accurately compensate for the drop in the high voltage signal VPP as required for a memory access.

Figure 5:
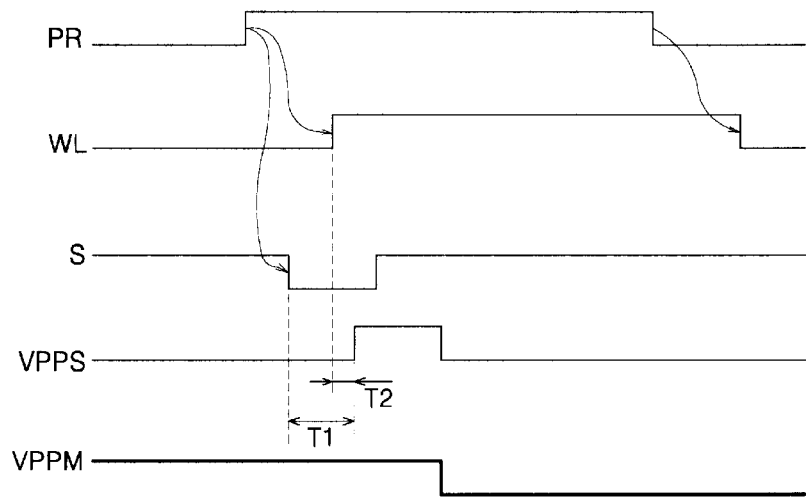
FIG. 5 is a timing diagram illustrating operation of the secondary high voltage detector shown in FIG. 3.

FIG. 5 is a timing diagram illustrating an example of the operation of the conventional high voltage generating circuit of a memory device. In FIG. 5, the secondary high voltage detector asserts the signal VPPM after the active signal PR is asserted. The word line WL is enabled after a predetermined time following assertion of the active signal PR. The secondary high voltage detector 10 generates a logic low signal on the node S in response to detecting the high voltage signal VPP at a voltage below a minimum target level while the active signal PR is asserted. Accordingly, the inverters I1, I2, and I3 assert the signal VPPS of a high level by buffering and inverting the logic low signal from the node S. In response to assertion of the signal VPPS, the secondary high voltage generator boosts the voltage level of the high voltage signal VPP. While the signal VPPM from the primary high voltage detector 14 is at a high level, the high voltage signal is at or below the minimum target voltage. As shown in FIG. 5, the word line may be enabled before the secondary high voltage detector 10 generates the signal VPPS and consequently before the secondary high voltage generator 12 boosts the high voltage level. As a result, the word line is enabled with a voltage lower than desired, and a voltage drop may result in the transfer of data signals through NMOS transistors in the memory.

More specifically, the high voltage generating circuit of the conventional semiconductor memory device delays the assertion of the signal VPPS by a time interval of T1 after the active signal PR is asserted and the node S falls to a low level. Relative to enabling the word line, the secondary high voltage detector 10 asserts the signal VPPS a time interval T2 after the word line WL is enabled. Accordingly, and the secondary high voltage generator cannot quickly and accurately compensate for a drop in the high voltage signal occurring before the word line is enabled, even when the primary high voltage detector 14 previously detects the drop and asserts the signal VPPM. This problem is more serious for faster memories because higher speed semiconductor memory devices enable word lines faster and give the secondary detector 10 less time to detect the voltage and direct the secondary high voltage generator 12 to compensate for a voltage drop.

Figure 6:
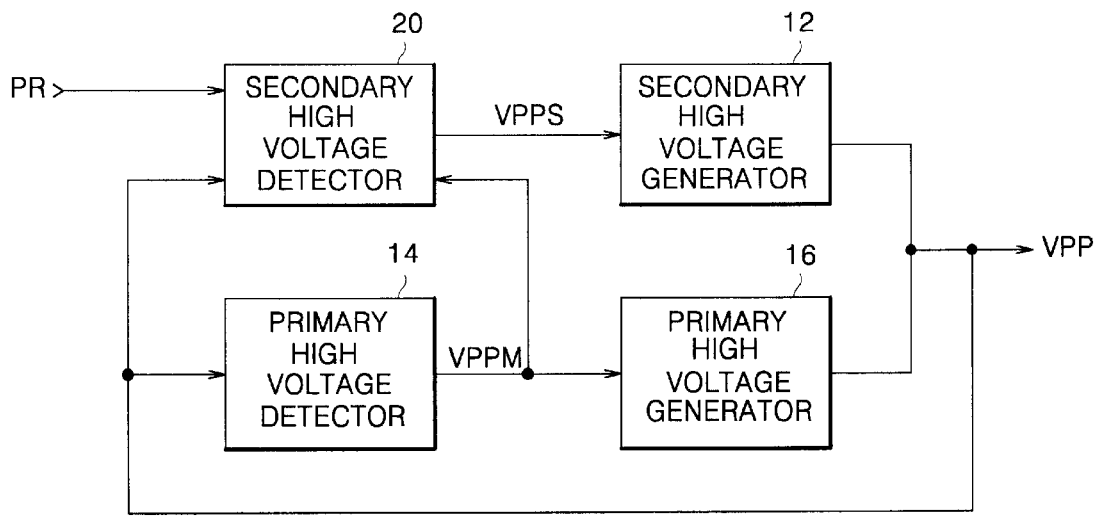
FIG. 6 is a block diagram illustrating an embodiment of a high voltage generating circuit of a semiconductor memory device according to an embodiment of the present invention.

FIG. 6 shows a high voltage generating circuit that includes a secondary high voltage generator 12, a primary high voltage detector 14, and a primary high voltage generator 16 having the same configuration and structure described above with reference to the circuit of FIG. 1. Operation of the secondary high voltage generator 12, the primary high voltage detector 14, and the primary high voltage generator 16 are also the same as those of the circuit illustrated in FIG. 1.

The high voltage generating circuit of FIG. 6 includes a secondary high voltage detector 20 that differs from the secondary high voltage detector 10 of FIG. 1. The secondary high voltage detector 20 is in active mode or enabled in response to the active signal PR and asserts the signal VPPS to a high level upon detecting the high voltage signal VPP below a minimum target voltage. However, the secondary high voltage detector 20 also asserts the signal VPPS to the high level if the signals VPPM and PR are at the high level. To implement this logic, the secondary high voltage detector 20 includes a circuit that asserts the signal VPPS to the high level if the signal VPPM from the primary high voltage detector 14 is at a high level when the signal PR enables the secondary detector 20.

Figure 7:
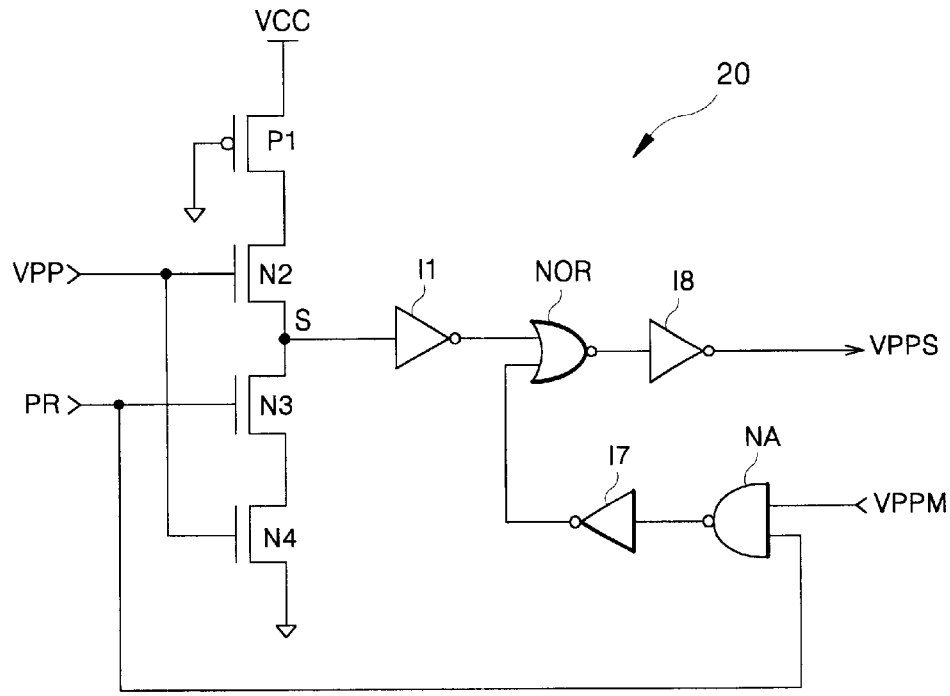
FIG. 7 is a circuit diagram illustrating an embodiment of a secondary high voltage detector shown in FIG. 6.

FIG. 7 shows an exemplary embodiment of the secondary detector 20 of FIG. 6. Referring to FIG. 7, the secondary high voltage detector 20 includes a PMOS transistor P1, NMOS transistors N2, N3, and N4, inverters I1, I7, and I8, a NAND gate NA, and a NOR gate NOR. The NOR gate NOR and the inverter I8 connect in series between the inverter I1 and an output terminal for the signal VPPS. The NAND gate NA and the inverter I7 perform an AND operation on the signals PR and VPPM and provide a result signal to the NOR gate NOR.

When the signal PR is at a high level, the PMOS transistor P1 and the NMOS transistors N2, N3, and N4 generate a signal at a high level on a node S if the high voltage signal VPP level is above a target level. The transistors P1, N2, N3, and N4 generate the signal at a low level on the node S if the high voltage VPP level is below the target level. The inverter I1 buffers and inverts the signal from the node S and provides the result to the NOR gate NOR. The NAND gate NA and the inverter I7 generate a signal at the high level only when the active signal PR and the signal VPPM from the primary high voltage detector 14 are at the high level. The NOR gate NOR and the inverter I8 generate the signal VPPS at the high level when the output signal from the inverter I1 or I7 is at a high level. Otherwise, the signal VPPS is at the low level.

When the signal VPPM from the primary high voltage detector 14 is at a high level, the primary detector has determined that the high voltage signal VPP is below a desired level. When signal PR rises to the high level, the NAND gate NA and the inverter I7 force the signal VPPS from the secondary high voltage detector 20 to the high level if the signal VPPM is asserted. The signal path through the NAND gate NA asserts signal VPPS faster so that the secondary high voltage generator 12 can boost the high voltage signal before a word line is enabled, when the primary detector detects a voltage drop.

Figure 8:
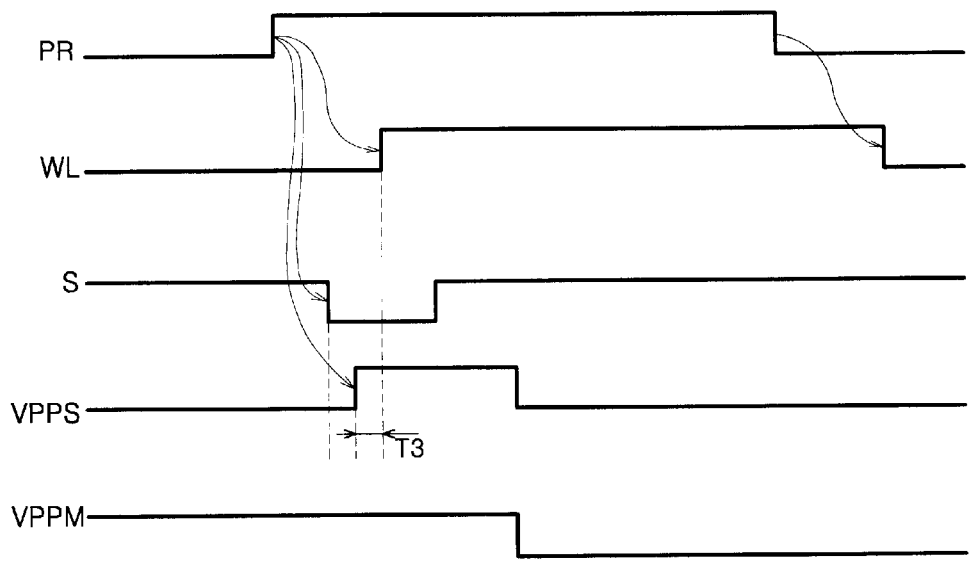
FIG. 8 is a timing diagram illustrating operation of the secondary high voltage detector shown in FIG. 7.

Referring to FIG. 8, when the signal PR is asserted, a word line WL is enabled after a predetermined time. The secondary high voltage detector 20 generates a signal at a low level on the node S upon detecting the drop of the high voltage VPP level when the signal PR is asserted. The NAND gate NA and the inverter I7 generate a signal at a high level by ANDing the signal PR and the signal VPPM from the primary high voltage detector 14. The signal VPPS of the secondary high voltage detector 20 quickly transitions to a high level regardless of the state of the node S, and particularly transfers to the high level a time T3 before the word line is enabled.

If the primary high voltage detector 14 does not assert the signal VPPM, the secondary high voltage detector 20 asserts the signal VPPS with the timing shown in FIG. 5. In particular, if the high voltage signal VPP is at a voltage level high enough that the primary high voltage detector 14 does not assert the signal VPPM, the secondary high voltage generator 12 is allowed to operate after the word line is enabled. The high voltage signal VPP remains at a sufficiently high level even though the secondary high voltage detector 12 operates in response to the signal VPPS generated from the signal at the node S.

The high voltage generating circuit of the present invention can quickly and accurately compensate for a voltage drop in the high voltage signal by operating the secondary high voltage generator according to the state of the primary high voltage detector. This allows the secondary high voltage generator to react more quickly after assertion of the enable signal PR. Accordingly, the secondary high voltage generator operates before the word line is enabled, and the high voltage signal on the enabled word line is high enough to avoid a voltage drop in the data signals being transferred. Accordingly, application of the high voltage generating circuit of the present invention can improve the reliability of a fast semiconductor memory device.

Although the invention has been described with reference to particular embodiments, the description is only an example of the invention's application and should not be taken as a limitation. Various adaptations, omissions, and combinations of features of the embodiments disclosed are within the scope of the invention as defined by the following claims.

What is claimed is:

1. A high voltage generating circuit, comprising: a secondary high voltage detector that is enabled by an active signal, wherein when
    enabled, the secondary high voltage detector asserts a second signal in
    response to detecting that a high voltage signal is below a first target level or in
    response to a first signal being asserted; a secondary high voltage generator that boosts the high voltage signal in response to
    the second signal; a primary high voltage detector that asserts the first signal in response to detecting the
    high voltage signal is below a second target level; and a primary high voltage generator that boosts the high voltage signal in response to the
    first signal.

2. The high voltage generating circuit as claimed in claim 1, wherein the secondary high voltage detector comprises:
    a first PMOS transistor and a first NMOS transistor connected in series between a power supply voltage and a first node, wherein gates of the first PMOS transistor and the first NMOS transistor respectively receive a ground voltage and the high voltage signal;
    a second NMOS transistor and a third NMOS transistor connected in series between the first node and the ground voltage, wherein gates of the second and third NMOS transistors respectively receive the active signal and the high voltage signal;
    a first inverter for inverting a signal from the first node and generating a third signal;
    AND logic that generates a fourth signal by ANDing he active signal and the first signal; and
    OR logic for generating the second signal by ORing he third signal and the fourth signal.

3. The high voltage generating circuit as claimed in claim 1, wherein the primary high voltage detector comprises:
    a first PMOS transistor and a first NMOS transistor connected in series between a power supply voltage and a node, wherein gates of the first PMOS transistor and the first NMOS transistor respectively receive a ground voltage and the high voltage signal;
    second and third NMOS transistors connected in series between the node and the ground voltage, wherein gates of the second and third NMOS transistors respectively receive the power Supply voltage and the high voltage signal; and
    a set of inverters connected in series for generating the first signal by buffering and inverting a signal from the node.

4. A high voltage generating circuit, comprising:
    a primary high voltage generating means for generating a first signal by detecting a drop of a high voltage signal and for boosting the high voltage signal in response to the first signal; and
    a secondary high voltage generating means for receiving an active signal, the high voltage signal, and the first signal, for generating a second signal in the event of at least one of detecting the drop of the high voltage signal, and the presence of the first signal, and for boosting the high voltage signal in response to the second signal.

5. The high voltage generating circuit as claimed in claim 4, wherein the secondary high voltage generating means comprises a secondary high voltage detector comprising:
    a first PMOS transistor and a first NMOS transistor connected in series between a power supply voltage and a first node, wherein gates of the first PMOS transistor and the first NMOS transistor respectively receive a ground voltage and the high voltage signal;
    a second NMOS transistor and a third NMOS transistor connected in series between the first node and the ground voltage, wherein gates of the second and third NMOS transistors respectively receive the active signal and the high voltage signal;
    a first inverter for generating a third signal by inverting a signal from the first node;
    AND logic for generating a fourth signal by ANDing the active signal and the first signal; and
    OR logic for generating the second signal by ORing the third signal and the fourth signal.

6. The high voltage generating circuit as claimed in claim 4, wherein the primary high voltage generating means comprises a primary high voltage detector comprising:
    a first PMOS transistor and a first NMOS transistor connected in series between a power supply voltage and a node, wherein gates of the first PMOS transistor and the first NMOS transistor respectively receive a ground voltage and the high voltage signal;
    a second NMOS transistor and a third NMOS transistor connected in series between the node and the ground voltage, wherein gates of the second and third NMOS transistors respectively receive the power supply voltage and the high voltage signal; and
    a set of inverters connected in series for generating the first signal by buffering and inverting a signal from the node.

* * * * *